(12) United States Patent
Miske

(10) Patent No.: US 7,514,983 B2
(45) Date of Patent: Apr. 7, 2009

(54) OVER-VOLTAGE TOLERANT PASS-GATE

(75) Inventor: Myron J. Miske, Newfields, NH (US)

(73) Assignee: Fairchild Semiconductor Corporation, South Portland, MA (US)

( * ) Notice: Subject to any disclaimer, the term of this patent is extended or adjusted under 35 U.S.C. 154(b) by 0 days.

(21) Appl. No.: 11/690,575

(22) Filed: Mar. 23, 2007

(65) Prior Publication Data

US 2008/0231341 A1    Sep. 25, 2008

(51) Int. Cl.
   *H03K 3/01*    (2006.01)
(52) U.S. Cl. .................................. 327/534; 327/537
(58) Field of Classification Search ................. 327/534, 327/537
   See application file for complete search history.

(56) References Cited

U.S. PATENT DOCUMENTS

| | | | | |
|---|---|---|---|---|
| 4,529,897 A | * | 7/1985 | Suzuki et al. | 327/437 |
| 5,818,099 A | | 10/1998 | Burghartz | |
| 5,963,080 A | * | 10/1999 | Miske et al. | 327/534 |
| 6,020,778 A | * | 2/2000 | Shigehara et al. | 327/534 |
| 6,100,719 A | * | 8/2000 | Graves et al. | 326/86 |
| 6,163,199 A | | 12/2000 | Miske et al. | |
| 6,169,443 B1 | * | 1/2001 | Shigehara et al. | 327/534 |
| 6,538,867 B1 | | 3/2003 | Goodell et al. | |
| 6,924,694 B2 | * | 8/2005 | Kinugasa et al. | 327/566 |
| 7,084,697 B2 | * | 8/2006 | Kawagoshi | 327/536 |
| 7,095,266 B2 | * | 8/2006 | Miske | 327/427 |
| 7,119,601 B2 | * | 10/2006 | Grimone, III | 327/404 |
| 2004/0232973 A1 | | 11/2004 | Kinugasa et al. | |
| 2006/0208787 A1 | | 9/2006 | Callahan | |

OTHER PUBLICATIONS

"PCT Notification of Transmittal of The International Search Report and the Written Opinion of the International Searching Authority, or the Declaration" for Int'l Appl. No. PCT/US2008/003333, mailed Jul. 29, 2008 by the European Patent Office, 12 pages.

* cited by examiner

*Primary Examiner*—Kenneth B. Wells
(74) *Attorney, Agent, or Firm*—Cesari and McKenna, LLP; Edwin H. Paul, Esq.

(57) ABSTRACT

A pass-gate having a single or parallel opposite polarity FETs is disclosed. The wells of the primary transistor switches are driven from circuitry that reduces over-voltage leakage and other malfunctions. A circuit that drives the wells is also used to power enable circuits that drive the gates of the pass transistors. The use of separate circuits to the gate and the wells further reduces leakage. In the condition of power supply voltage and signal levels that are near the thresholds of the FETs involved, one or more Schottky diodes may be used across pn junctions in the FETs that will prevent turning on the pn junctions.

18 Claims, 4 Drawing Sheets

OVER-VOLTAGE TOLERANT PASS-GATE

CROSS-REFERENCE TO RELATED APPLICATIONS

The present application is related to an application, owned by the same entity, entitled, Method for Reducing Insertion Loss and Providing Power Down Protection in MOSFET Switches, Ser. No. 11/673,259, which was filed on Aug. 18, 2004. This prior application is hereby incorporated herein by reference.

BACKGROUND OF THE INVENTION

1. Field of the Invention

The present invention relates to MOSFET devices and particularly to MOSFET devices used as low on-impedance switches.

2. Background Information

MOSFET switches are found in many applications and have become common in high frequency, pass-gate switch applications. As technology progressed, such transistor switches became smaller, faster and more power efficient. Often these low on-impedance switches are used to transfer logic data between systems using different power sources, say a 5V system sending and/or receiving logic signals from a 3V system. Typically the power sources determine the high logic levels. Such switches may couple logic systems powered from 5V, 3.3V and/or 1.8V to each other.

Operation at the lower power supply levels, however, encounters issues with respect to threshold requirements inherent in MOSFET transistors. For example, in systems with differing power sources, trouble might be encountered where a logic signal sent from a system is higher than the power supply of the receiving system. Over/under-voltage effects are known to cause catastrophic MOSFET failures.

Known approaches that protect pass-gate switch transistors from over/under-voltages come at a price. For example, using two FETs in series will increase channel resistance, or use increased chip area if the FETs are made larger to reduce channel resistance. Other approaches, as in the above referenced patent application, may not provide full over/under-voltage protection during power up and/or power down operations.

Another approach to over/under-voltage protection is discussed in U.S. Pat. No. 6,163,199 ('199), entitled: "Overvoltage/Undervoltage Tolerant Transfer Gate." The '199 patent is owned in common with the present application and patent is hereby incorporated herein by reference. The '199 patent provides a more detailed discussion of the limitations of the prior art along with an advance using parallel transistors arranged for over under/under-voltage protection by driving the back gates (bulk contacts) of the transfer transistors involved.

Other known designs focus on lowering insertion loss and increasing the band-width by minimizing the "body effect" that is inherent in MOSFET structures. Insertion loss can be described, generally, as the loss of signal power delivered to a load due to the addition of a less than perfect switch compared to that if the switch were perfect.

A representative prior art design focused on reducing the body effect and insertion loss is found in U.S. Pat. No. 5,818,099 ('099) to Burghartz. The '099 patent describes an n-type MOSFET structure with a p-well that is isolated from the p-type substrate using an n-type well as shown in FIG. 6A of the '099 patent. The '099 low insertion loss circuit embodiment, however, may have larger leakage when there is a signal voltage present and the supply voltage to the transfer switch is turned off, e.g., when power is turned off first to the transfer switch before it is turned off at the sending or receiving systems. Moreover, the switch may become turned on when it should be off during power down.

For example, in FIG. 1 of the '099, a p-type MOSFET is shown with typical biasing of the well to +V. This ensures that the drain/source to well pn junction diode does not become forward biased. However, if the +V supply is at ground (by the supply being turned off) while there is a high logic level, say +5V, at terminal A, the pn drain-well diode in the MOSFET switch is forward biased creating a potentially harmful current path that charges the output capacitor of the +V supply. So the well of the p-type MOSFET will be charged and, thus, the switch is powered when it should be unpowered.

Well current to the Vdd power supply rail may be termed well leakage and remains an issue in some prior art circuits. One bias condition exists where the potential differences among the drain, source and Vdd may be too small for known circuitry to correctly resolve. The present invention addresses this prior art limitation as well as others.

There remain, in prior art MOSFET pass-gate switches, limitations in providing over-voltage tolerance and protection for all values of supply power (Vdd) as may be encountered during normal operations and/or during power up and power down operations. Prior art circuits are especially vulnerable during power up operations, where, for example, an off pass-gate may not remain off during such operations and where excessive leakage currents may occur.

The present invention is directed, inter alia, towards these limitations.

SUMMARY OF THE INVENTION

The limitations and issues in the prior art are addressed by the present invention that provides a pass-gate of a single or, as in some applications, parallel primary switch FETs. The primary switch FETs, for example, would be M1 and M2 of FIG. 1. The parallel switch arrangement is described herein, but, those skilled in the art, will understand the present invention using a single primary switch FET.

The present invention provides for the well or wells of the primary switch FETs to be driven so that the inherent pn junctions and the parasitic transistors do not become forward biased by the various power supply voltage and signal level voltages that may be found in pass-gate operations. That is, a +1.8 voltage signal being transferred via electronics powered from +5V to another +5V logic system will not suffer high leakage, breakdowns or other malfunctions.

For a primary switch PMOS FET, the well is functionally coupled to the most positive voltage of the local power supply or the input signal voltages, and for an NMOS the lowest voltage of local power supply or the input signal voltages.

Herein "functionally connected" is defined as connected directly or having intervening components that substantially do not interfere with the operations.

The present invention also provides a low forward voltage drop diode, preferably a Schottky diode, located across pn junctions, wherein the diode low forward drop prevents the pn junction in the pass transistor from turning on. In an embodiment, the Schottky is placed from +Vdd (diode anode) to the well (diode cathode) of the switch transistor. For example, the pn junction of drain or source to the well of a primary switch PMOS, with +Vdd at the well, will be limited to the forward diode drop. The diode drop is low enough so that the pn junction is not turned on.

The present invention provides a mechanism to reduce leakage at the wells and the gates of the primary switches, and to ensure proper enablement of the switches under the various signal and power levels encountered by a pass-gate. In this regard the power supply for the circuit that is meant to turn on and off the pass-gate (the enabling circuit) has a circuit, in one embodiment, that is identical to that connected to the well of a PMOS primary switch transistor. The separate circuit used to drive the enabling circuit, even though it may be identical to the circuit connected to the well of the PMOS primary switch, has the beneficial effect of reducing any gate leakage without negatively affecting the reduction of larger well leakage.

The circuit functionally powering the enable circuit also has the Schottky diodes as described above. Here the voltage level powering the enabling circuit will be the higher of one of the input signal levels, +Vdd, but that voltage level will be at minimum a Schottky diode drop lower than +Vdd. A benefit is that the off state of the pass switches will remain off regardless of the signal levels and +Vdd power supply and during power down.

It will be appreciated by those skilled in the art that although the following Detailed Description will proceed with reference being made to illustrative embodiments, the drawings, and methods of use, the present invention is not intended to be limited to these embodiments and methods of use. Rather, the present invention is of broad scope and is intended to be defined as only set forth in the accompanying claims.

BRIEF DESCRIPTION OF THE DRAWINGS

The invention description below refers to the accompanying drawings, of which.

DETAILED DESCRIPTION OF AN ILLUSTRATIVE EMBODIMENT

Figure 1:
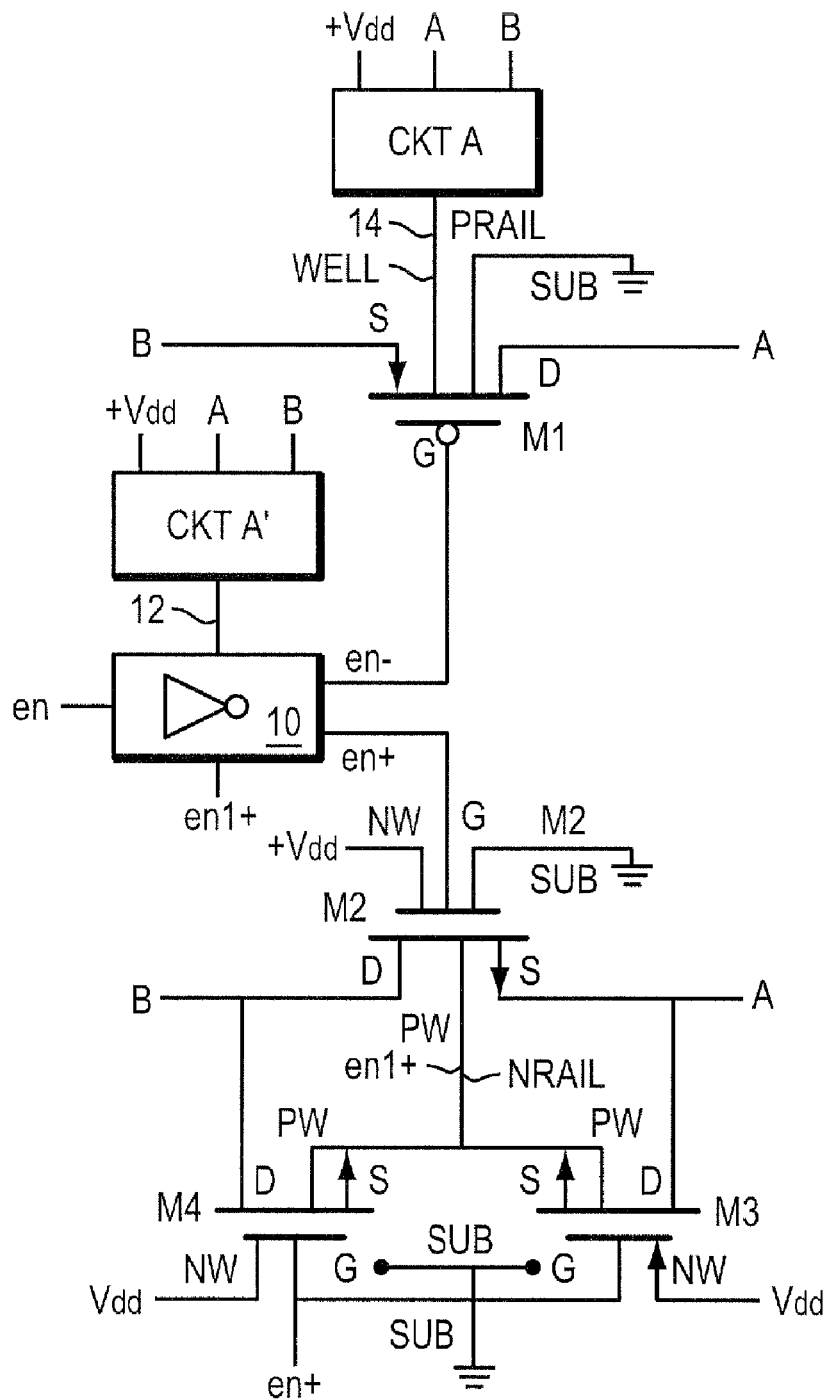
FIG. 1 is a block diagram schematic illustrating the present invention.

FIG. 1 has a PMOS, M1, and an NMOS, M2, in parallel, joining point A to point B. These two MOS transistors are the primary parallel transistor switches that comprise a pass-gate. The substrate contacts, SUB, of each of the transistor switches are functionally connected to ground. The WELL of PMOS M1 is tied to CKT A, its gate G to an enable signal, en−, its drain to external contact A and its source to external contact B. In normal operation the pass-gate transfers signals from A to B or vice versa.

The drain of the parallel NMOS, M2, is functionally connected to external contact B, and its source to external contact A. As known to those skilled in the art, the drain and source of these transistors often may be reversed with no effect. The gate G of M2 is connected to a positive true enable signal, en+, and to the gates of M2 and M3, as discussed below. The PW (P Well) is connected to a positive true enable signal, en1+, and the NW (N-Well) of the M2 is connected to +Vdd.

Symmetrical NMOS transistors M3 and M4 provide a signal path from point A to the PW connection of M2 and then to point B. This has the beneficial effect of enhancing bandwidth and lowering insertion loss. When M2 is turned on, an AC signal on point A appears at point B or at both the source and drain of M2. Even with minimal drop across M1, some of that AC signal would be siphoned off through capacitors from both the source and the drain to the well, Csw and Cdw, of M2. However, in the present invention, when M3 and M4 are on, their low on resistances will tend to maintain a substantially constant AC voltage across both Csw and Cdw and thereby limit AC signal loss with frequency through these capacitors. This reduces the insertion loss with frequency and increases the bandwidth of the switch. M3 and M4 are of the same size so that any voltage drop from A to B is shared equally. This symmetry enhances the operation of the circuit with M2.

Figure 2:
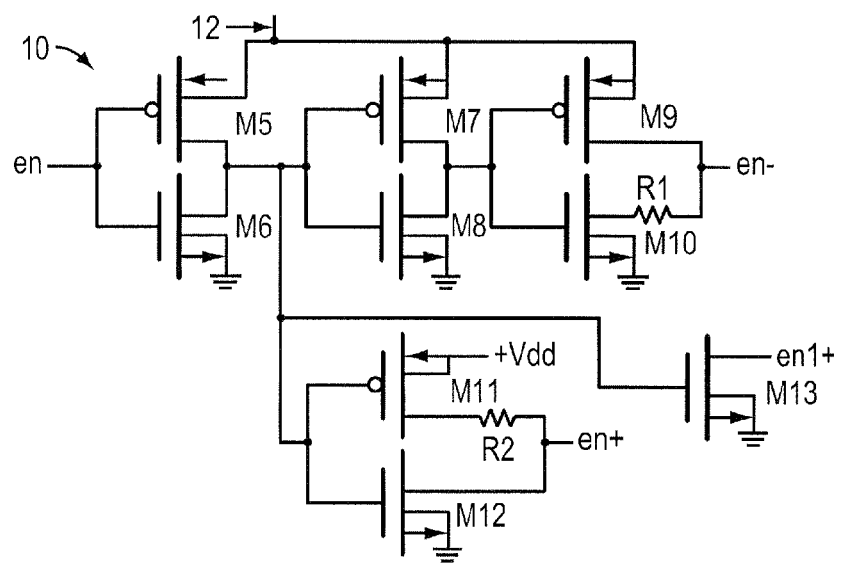
FIG. 2 is a schematic of an enabling circuit.

The enable signals are generated by a circuit 10 shown in FIG. 2. The usual power source, +Vdd, for the enable circuit is replaced in an embodiment of the present invention by CKT A', a duplicate of CKT A, see FIG. 4. In FIG. 2, M5 and M6 form a typical inverter, as do M7 and M8, and M9 and M10. The inverter M9 and M10 outputs en− that drives the gate of M1. The inverter M11 and M12 outputs en+ that drives the gates of M2, M3 and M4. The resistor R1 slows the turn on signal for M1 and the resistor R2 slows the turn on of M2. The slower signals smooth the turn on of the pass-gate switches. M13 outputs en1+ that drives the PW of NMOS M2.

Point 12 typically is connected to +Vdd, but in this embodiment, point 12 is connected to CKT A' as described below. The connection to CKT A' combined with the CKT A, as discussed below, reduce total leakage from the gate (CKT A') of M1 and from the WELL of M1 (CKT A).

Figure 3A:
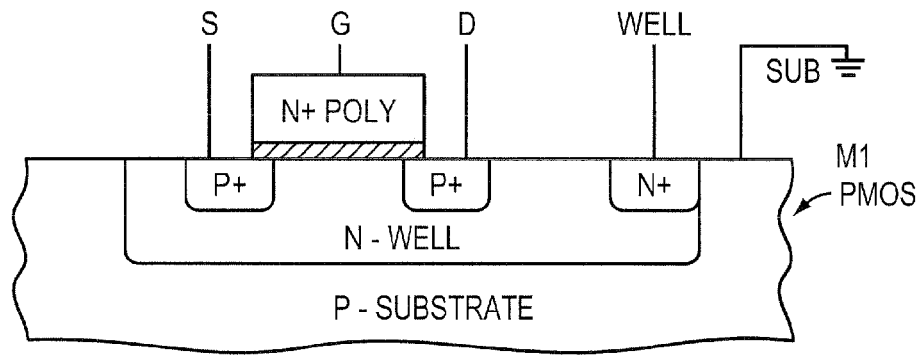
FIGS. 3A and 3B are cross sections views of PMOS and an NMOS examples of primary transistors.
Figure 3B:
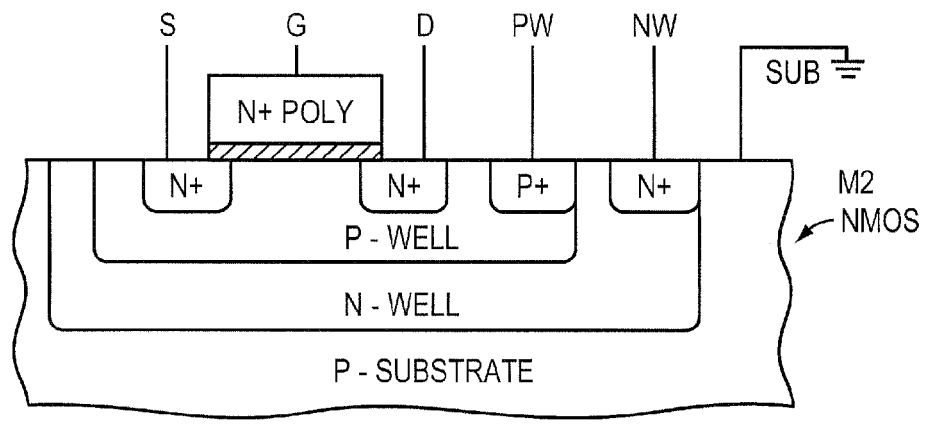

FIGS. 3A and 3B illustrate cross section views of PMOS M1 and an isolated NMOS M2, respectively. The pn junctions indicate diodes and parasitic transistors that may affect operations of the switches under the various circumstances of power supply potentials, input/output signal potentials and sequencing of power supplies and signals during power up and power down of the circuits involved. For example, the PMOS M1 of FIG. 3A forms a parasitic pnp transistor from the p-type drain or source to the n-type well to the p-type substrate (SUB). Moreover, any of the pn junctions form parasitic diodes that may produce problems when or if forward biased. There are similar diodes and transistors in the NMOS, but with an additional layer, the NI (N ISOLATION), there are even more parasitics to contend with. As mentioned above, one goal is to maintain isolation during the power up/down sequencing while nullifying leakage back to the power supply.

Figure 4:
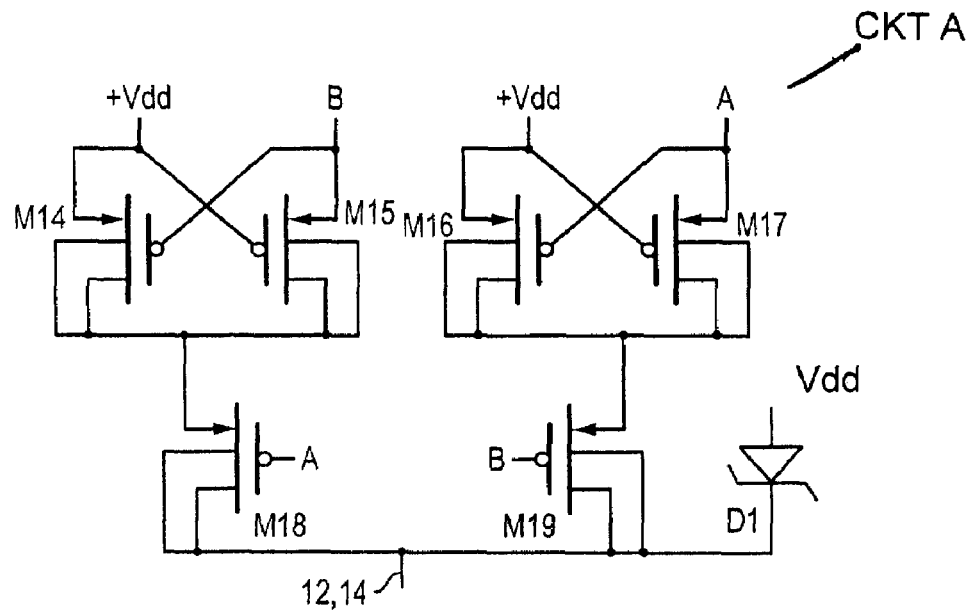
FIG. 4 is a schematic of a circuit used to power the PMOS primary transistor and a duplicate circuit used to power the enabling circuit.

FIG. 4 is a schematic for CKT A and A'. All the transistors are PMOS and all their substrate connections (not shown) are tied to ground.

The initial discussion relates to the circuit comprising M14, M15 (cross coupled transistors) and M18 that drives the WELL of the PMOS M1 via the prail 14. This circuit illustrates circuitry that provides over-voltage protection for the PMOS M1. When the en is false, the signal, en−, at the gate of M1 is high and M1 is off (the pass-gate or switch is off). There is a high impedance connection between A and B (because M2 is also off). If A is low, M18 is on, and if B is low, +Vdd appears at the prail 14. If B is high and +Vdd is low, B will appear at the prail 14. The higher of +Vdd or B will be fed to the prail 14. Similarly, M16 and M17 (cross coupled transistors), and M19 will drive the prail 14 to the higher of +Vdd or A, whichever is higher, when B is low. If +Vdd, A and B were all low and the circuit is benign—nothing happens.

In prior art circuits, the WELL is often connected to +Vdd, and the pn junction of the source or drain to the WELL of M1 may become forward biased if +Vdd was low. The circuit CKT A prevents that.

When M1 is biased on via en− (and M2 will be on via en+), CKT A will prevent leakage to the +Vdd. In this case, if +Vdd goes to low while A and B are high, CKT A disconnects the WELL of M1 from the +Vdd, preventing leakage. If +Vdd, A and B are all low (A and B must be equal if the pass-gate is on), the pn junction still will not be forward biased and there will be no leakage. Moreover within thresholds, if either A or B or +Vdd goes below ground the WELL will be maintained at the higher of A, B or +Vdd by CKT A.

Figure 5:
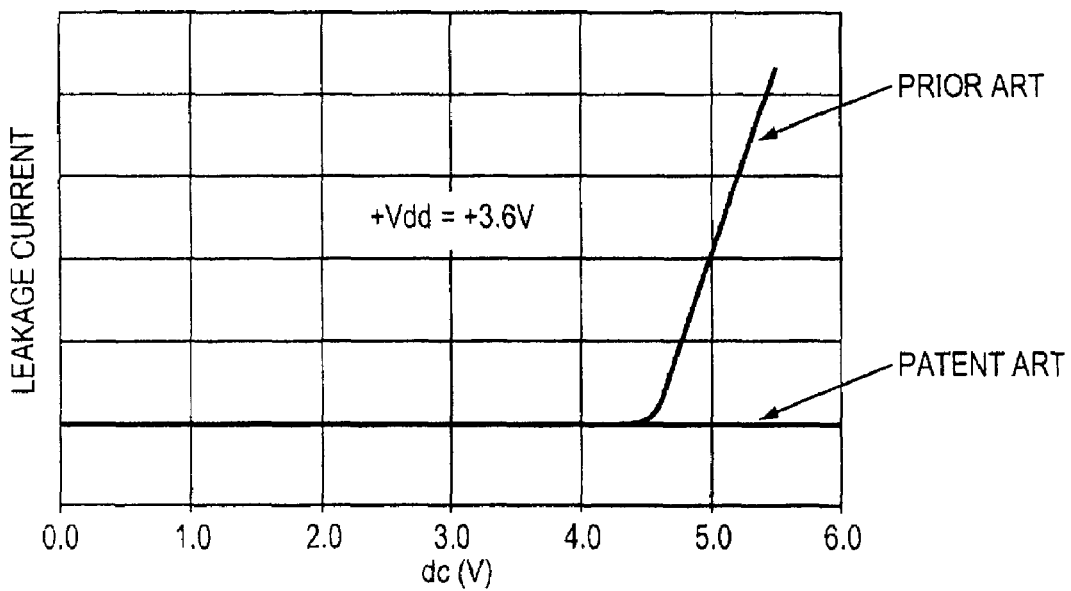
FIG. 5 is a graph illustrating excessive leakage of currents found in prior art pass-gates.

FIG. 5 is a representative graph of leakage current versus DC voltages (over-voltages) that may occur in some prior art circuits when the +Vdd is at +3.6V. The graph represents a combination of possible leakage paths. Leakage currents may flow through many paths that may occur from the switch transistor M1 to ground, to +Vdd, to A, to B or between points A and B. For example, inspection of the circuit of FIG. 4 illustrates that when the DC levels of +Vdd, B and A are nearer to each other than the thresholds of the PMOS transistors M14, M15, M16, M17, M18 and M19, the prail 14 (and 12) may be effectively floating. In this situation, the voltage of the WELL of M1 may begin to droop and turn on the parasitic pnp transistor composed of the drain or source of M1 to the substrate of M1. In practice, the voltages where this may happen often are around +5V when +Vdd is at +3.6V. This is demonstrated by the rising current around +4.5V in FIG. 5.

The Schottky diode D1 is provided to reduce the prior art leakage due to this droop in and thereby prevent the parasitic pnp from turning on.

Schottky diodes are semiconductor/metal structures with small forward voltage drops. In this application D1 is arranged to prevent the drain or source to WELL pn junction, and thus the parasitic pnp transistor of M1, from turning on. As known to those skilled in the art, smaller multiple Schottky diodes may be used replacing D1. Such diodes would be in parallel with each other to further minimize the forward voltage drop.

Referring back to FIG. 1 and FIG. 2, the enable circuit 10 derives power from CKT A' which is an identical circuit to CKT A as described above. In this instance the voltage at the sources of M5, M7 and M9 will be the higher of +Vdd, B or A, as described above. If these three signals are low, neither M10 nor M11 nor M1 nor M2 will turn on regardless of the input en signal. If any one of these signals are high, the proper enable signal will reach the gates of M1 and M2. As described above, if these three signals are close to each other in magnitude, the PMOS circuitry of CKT A' may not function. As before, the Schottky diode D1 found in CKT A' will keep the point 12 close to the potential of +Vdd (within the forward Schottky diode drop).

With respect to CKT a and CKT A', the transistor implementation shown herein may be replaced by other circuitry known in the art that will perform the same logic function of selecting the higher of A, B or +Vdd and presenting it to points 12 and 14.

Figure 6:
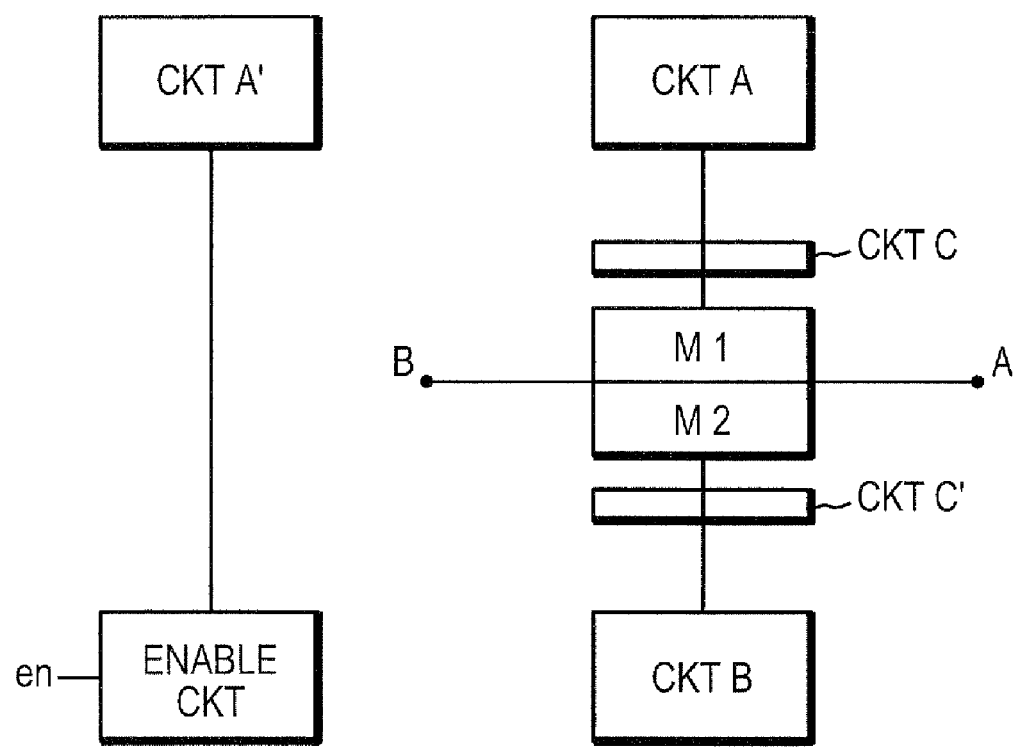
FIG. 6 is a block diagram illustrating use of the present invention for a PMOS switch and a parallel NMOS switch.

FIG. 6 illustrates in block form, the PMOS CKT A as described above operating on M1. As would be known to those skilled in the art, there may be a corresponding circuit, CKT B, operating on M2 as CKT A does with Ml. Moreover, CKT C' comprising M3 and M4, operates on M2 to enhance bandwidth, may have a corresponding circuit, CKT C, with transistors, similarly positioned as are M3 and M4, that enhance the band-width of M1.

In each case, the WELL of M1 will not be biased lower than its drain/source and so the drain/source to well pn junction of M1 will not be forward biased.

It should be understood that above-described embodiments are being presented herein as examples and that many variations and alternatives thereof are possible. Accordingly, the present invention should be viewed broadly as being defined only as set forth in the hereinafter appended claims.

What is claimed is:

1. A pass-gate comprising:
    a field effect first pass transistor having at least a gate, source, drain, well and substrate, wherein an input signal is received at the drain or source and an output signal is presented at the source or drain, respectively; and
    second and third transistors having their respective drains functionally connected to the well of the first pass transistor, the gate of the second transistor functionally connected to the source of the first transistor, and the gate of the third transistor functionally connected to the drain of the first pass transistor;
    the source of the second transistor functionally connected to first cross coupled transistors, the first cross coupled transistors arranged to present to the source of the second transistor the higher of a power supply voltage or the signal voltage on the drain of the first pass transistor; and
    the source of the third transistor functionally connected to second cross coupled transistors, the second cross coupled transistors arranged to present to the source of the third transistor the higher of the positive potential or the signal voltage on the source of the first pass transistor.

2. The pass-gate of claim 1 further comprising a diode with its anode connected to the positive potential of the power supply and its cathode connected to the well of the first pass transistor, wherein the forward voltage drop of the diode is low enough to prevent the pn junction of the drain or source to the well of the first pass transistor from turning on.

3. The pass-gate of claim 2 wherein the diode is a Schottky diode.

4. The pass-gate of claim 2 wherein the diode comprises two or more Schottky diodes in parallel.

5. The pass-gate of claim 1 further comprising an enable circuit defining a power contact for providing power to the enable circuit, an enable input and an enable output, the enable output functionally connected to the gate of the first pass transistor.

6. The pass-gate of claim 5 further comprising a second bias circuit defining an output functionally connected to the power contact of the enable circuit, the second bias circuit defining a fourth contact functionally connected to the input signal, a fifth contact functionally connected to the output and a sixth contact functionally connected to the positive potential of a power supply, wherein the highest voltage is presented to the power contact of the enable circuit.

7. The pass-gate of claim 6 further comprising a diode with its anode connected to the positive potential of the power supply and its cathode connected to the power contact for providing power to the enable circuit.

8. The pass-gate of claim 7 wherein the diode comprises Schottky diode.

9. The pass-gate of claim 8 wherein the diode comprises two or more Schottky diodes in parallel.

10. A method for connecting an input to and disconnecting the input from an output, respectively, the method comprising the steps of:
    turning on a field effect first pass transistor having at least a gate, source, drain, well and substrate, wherein an input signal is received at the drain or source and an output signal is presented at the source or drain, respectively; and functionally connecting the drains of second and third transistors to the well of the first pass transistor;

functionally connecting the gate of the second transistor to the source of the first transistor and the gate of the third transistor to the drain of the first pass transistor;

functionally connecting the source of the second transistor to first cross coupled transistors, the first cross coupled transistors arranged to present to the source of the second transistor the higher of a power supply voltage or the signal voltage on the drain of the first pass transistor; and functionally connecting the source of the third transistor to second cross coupled transistors, the second cross coupled transistors arranged to present to the source of the third transistor the higher highest voltage of the positive potential of the power supply voltage or the signal voltage on the source of the first pass transistor.

11. The method of claim 10 further comprising the step of functionally connecting a first diode anode to the power supply voltage and its cathode to the well of the first pass transistor, wherein the forward voltage drop of the diode is low enough to prevent the pn junction of the drain or source to the well of the first pass transistor from turning on.

12. The method of claim 11 further comprising the step of functionally connecting one or more diodes in parallel with the first diode.

13. The method of claim 10 further comprising the steps of:
generating an enable signal from an enable circuit and connecting the enable signal to the gate of the first pass transistor.

14. The method of claim 13 wherein the step of generating an enable signal comprises the step of powering the enable circuit from the highest voltage selected from among the input signal, the output signal and a positive potential of a power supply.

15. The method of claim 14 wherein the step of powering the enable circuit comprises the steps of:
functionally connecting a second bias circuit defining an output that powers the enable circuit;
functionally connecting the input signal, the output and a power supply to the second bias circuit; and
selecting the higher voltage selected from among the input signal, the output signal and the positive potential of the power supply to power the enable circuit.

16. The method of claim 15 further comprising the step of connecting the anode of a diode to the power supply voltage and its cathode to the enable circuit for providing power to the enable circuit.

17. The method claim 16 wherein the diode comprises a Schottky diode.

18. The method of claim 16 further comprising the step of functionally connecting one or more diodes in parallel with the first diode.

\* \* \* \* \*

UNITED STATES PATENT AND TRADEMARK OFFICE
CERTIFICATE OF CORRECTION

PATENT NO. : 7,514,983 B2 Page 1 of 1
APPLICATION NO. : 11/690575
DATED : April 7, 2009
INVENTOR(S) : Myron J. Miske It is certified that error appears in the above-identified patent and that said Letters Patent is hereby corrected as shown below:

(73)     Assignee:     Fairchild Semiconductor Corporation,
South Portland, ~~MA~~ ME (US)

Signed and Sealed this

Fourth Day of May, 2010

David J. Kappos
*Director of the United States Patent and Trademark Office*